United States Patent
Takahashi et al.

(10) Patent No.: US 9,190,145 B2
(45) Date of Patent: Nov. 17, 2015

(54) DRIVE METHOD FOR MEMORY ELEMENT AND STORAGE DEVICE USING MEMORY ELEMENT

(75) Inventors: Tsuyoshi Takahashi, Tsukuba (JP); Yuichiro Masuda, Tsukuba (JP); Shigeo Furuta, Tsukuba (JP); Touru Sumiya, Tsukuba (JP); Masatoshi Ono, Tsukuba (JP); Yutaka Hayashi, Tsukuba (JP); Toshimi Fukuoka, Tsukuba (JP); Tetsuo Shimizu, Tsukuba (JP); Kumaragurubaran Somu, Tsukuba (JP); Hiroshi Suga, Narashino (JP); Yasuhisa Naitou, Tsukuba (JP)

(73) Assignees: National Institute of Advanced Industrial Science and Technology, Tokyo (JP); Funai Electric Co., Ltd., Daito-shi (JP)

( * ) Notice: Subject to any disclaimer, the term of this patent is extended or adjusted under 35 U.S.C. 154(b) by 313 days.

(21) Appl. No.: 13/819,247

(22) PCT Filed: Aug. 25, 2011

(86) PCT No.: PCT/JP2011/069117
§ 371 (c)(1),
(2), (4) Date: Feb. 26, 2013

(87) PCT Pub. No.: WO2012/026507
PCT Pub. Date: Mar. 1, 2012

(65) Prior Publication Data
US 2013/0170285 A1 Jul. 4, 2013

(30) Foreign Application Priority Data
Aug. 26, 2010 (JP) ................. 2010-189133

(51) Int. Cl.
*G11C 11/00* (2006.01)
*G11C 13/00* (2006.01)
*H01L 27/10* (2006.01)

(52) U.S. Cl.
CPC ........ *G11C 13/0069* (2013.01); *G11C 13/0002* (2013.01); *H01L 27/101* (2013.01); *G11C 2213/79* (2013.01)

(58) Field of Classification Search
CPC ....................................................... G11C 11/00
USPC ............. 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS

2003/0076649 A1* 4/2003 Speakman .................... 361/524
2004/0151014 A1* 8/2004 Speakman ...................... 365/49
(Continued)

FOREIGN PATENT DOCUMENTS

CN 101273461 A 9/2008
JP 2007-123828 A 5/2007
(Continued)

OTHER PUBLICATIONS

International Search Report including English language translation dated Nov. 8, 2011(Four (4) pages).
(Continued)

*Primary Examiner* — Harry W Byrne
(74) *Attorney, Agent, or Firm* — Crowell & Moring LLP

(57) ABSTRACT

In a drive method for a memory element that includes an insulating substrate, a first electrode and a second electrode provided on the insulating substrate, and an inter-electrode gap portion provided between the first electrode and the second electrode and having a gap of the order of nanometers where a phenomenon of a change in resistance value between the first and second electrodes occurs, and that can perform a transition from a predetermined low-resistance state to a predetermined high-resistance state and a transition from the high-resistance state to the low-resistance state, a current pulse is applied to the memory element by a constant current circuit upon the transition from the high-resistance state to the low-resistance state.

2 Claims, 11 Drawing Sheets

(56) References Cited

U.S. PATENT DOCUMENTS

| | | |
|---|---|---|
| 2006/0067105 A1 | 3/2006 | Fang et al. |
| 2006/0164880 A1* | 7/2006 | Sakamoto et al. ............ 365/153 |
| 2007/0047323 A1* | 3/2007 | Murooka et al. ......... 365/185.23 |
| 2007/0087564 A1* | 4/2007 | Speakman .................... 438/674 |
| 2007/0132003 A1* | 6/2007 | Takashima et al. ........... 257/315 |
| 2008/0123393 A1 | 5/2008 | Kinoshita |
| 2009/0161407 A1* | 6/2009 | Masuda et al. ................ 365/148 |
| 2009/0251199 A1 | 10/2009 | Naitoh et al. |
| 2010/0202185 A1 | 8/2010 | Katoh et al. |

FOREIGN PATENT DOCUMENTS

| | | |
|---|---|---|
| JP | 2008-517407 A | 5/2008 |
| JP | 2009-205709 A | 9/2009 |
| JP | 2010-157568 A | 7/2010 |
| WO | WO 2007/074504 A1 | 7/2007 |

OTHER PUBLICATIONS

International Preliminary Report on Patentability with Written Opinion (PCT/ISA/237) including English translation Dated Feb. 26, 2013 {Ten (10) pages}.

* cited by examiner

DRIVE METHOD FOR MEMORY ELEMENT AND STORAGE DEVICE USING MEMORY ELEMENT

TECHNICAL FIELD

The present invention relates to a drive method for a memory element including nano-gap electrodes, and a storage device using the memory element.

BACKGROUND ART

At present, with the miniaturization and increase in the density of devices, finer electric elements are desired. As one example thereof, there is known an element capable of performing switching operation by applying a voltage between two electrodes with a fine gap (nano-gap) provided therebetween.

Specifically, for example, an element is developed that is made of stable materials (silicon oxide and gold), fabricated by a simple fabrication method (oblique deposition) and can stably and repeatedly perform switching operation (see, for example, Patent Literature 1).

In such an element having a nano-gap (hereinafter, referred to as a "nano-gap memory element"), to perform writing or erasing, a shift (transition) from a high-resistance state (OFF state) to a low-resistance state (ON state) or a shift from the low-resistance state (ON state) to the high-resistance state (OFF state) is performed by application of a voltage pulse having a predetermined voltage value.

PRIOR ART LITERATURE

Patent Literature

Patent Literature 1: JP 2007-123828 A

SUMMARY OF INVENTION

Problem to be Solved by the Invention

However, there is a problem that particularly when a transition from the high-resistance state to the low-resistance state is performed, the probability of a transition to a desired resistance state (low-resistance state) is low even if a voltage pulse is applied. Hence, to improve the probability of transition from the high-resistance state to the low-resistance state, countermeasures such as increasing the pulse width (i.e., the application time of one voltage pulse), increasing the voltage value, and the like are considered. However, these methods have a problem that the probability of a transition from the high-resistance state to the low-resistance state is still not sufficient.

An object of the present invention is to provide a drive method for a memory element that allows the memory element to shift from a high-resistance state to a low-resistance state with high probability, and a storage device using the memory element.

Means to Solve the Problem

According to a first aspect of the present invention, there is provided a drive method for a memory element that includes an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs, in which a state of the memory element can be shifted (transitioned) from a predetermined low-resistance state to a predetermined high-resistance state and from the high-resistance state to the low-resistance state. The method includes a step of applying a current pulse to a memory element by a constant current circuit upon a shift (transition) from a high-resistance state to a low-resistance state.

A second aspect of the present invention includes the same configuration as the first aspect of the invention, and the current pulse is applied through the constant current circuit such that a current value changes in a stepwise manner.

According to a third aspect of the present invention, there is provided a storage device that includes a memory element including an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs; and a current pulse generating unit that generates a current pulse for performing a shift from a high-resistance state to a low-resistance state. The current pulse generating unit applies the current pulse to the memory element by a constant current circuit.

A fourth aspect of the present invention includes the same configuration as the third aspect of the invention, and the current pulse generating unit applies the current pulse by the constant current circuit such that a current value changes in a stepwise manner.

According to a fifth aspect of the present invention, there is provided a storage device that includes a memory element comprising an insulating substrate, a first electrode and a second electrode provided on the insulating substrate, and an inter-electrode gap portion provided between the first electrode and the second electrode and having a gap of an order of nanometers where a phenomenon of a change in resistance value between the first and second electrodes occurs; and a voltage pulse generating unit. There are a plurality of memory elements, and at least a constant current element is series-connected to each of the memory elements, and a voltage pulse is applied from the voltage pulse generating apparatus to at least one memory element to which the constant current element is series-connected.

By this configuration of the memory element, the write speed is improved although there is a possibility of an increase in memory cell area.

Effects of the Invention

As a result of diligent studies to solve the above-described problem, the inventors have focused on applying a current pulse to a memory element to allow the memory element to transition from a high-resistance state to a low-resistance state. The current pulse is supplied also through a constant current circuit, but by performing voltage drive of a memory cell to which a constant current element is connected, a current pulse is also applied to a memory element. The inventors have found that by applying a current pulse, the memory element transitions from the high-resistance state to the low-resistance state with higher probability.

According to the present invention, it is characterized that in a memory element including an inter-electrode gap portion having a gap of the order of nanometers where a transition from a predetermined low-resistance state to a predetermined high-resistance state and a transition from the high-resistance state to the low-resistance state are performed, when applying to the memory element a current pulse that allows the memory element to transition from the high-resistance state to the low-resistance state, the current value is controlled using a constant current circuit, or voltage drive of the memory element to which a constant current element is connected is performed.

Conventionally, the success rate of switching from the high-resistance state to the low-resistance state is lower than that of switching from the low-resistance state to the high-resistance state. However, by applying a current pulse in the above-described manner, the success rate of switching from the high-resistance state to the low-resistance state can be dramatically improved.

For example, in a repetition test in which switching from the low-resistance state to the high-resistance state and switching from the high-resistance state to the low-resistance state are alternately performed, switching of the state between the low-resistance state and the high-resistance state is more securely performed, and a range to which resistance values for the low-resistance state belong and a range to which resistance values for the high-resistance state belong are divided, with almost no overlap between the ranges. As a result, the memory element can be maintained in two identifiable states, enabling to further improve adaptability as a storage device.

DESCRIPTION OF EMBODIMENTS

Figure 1A:
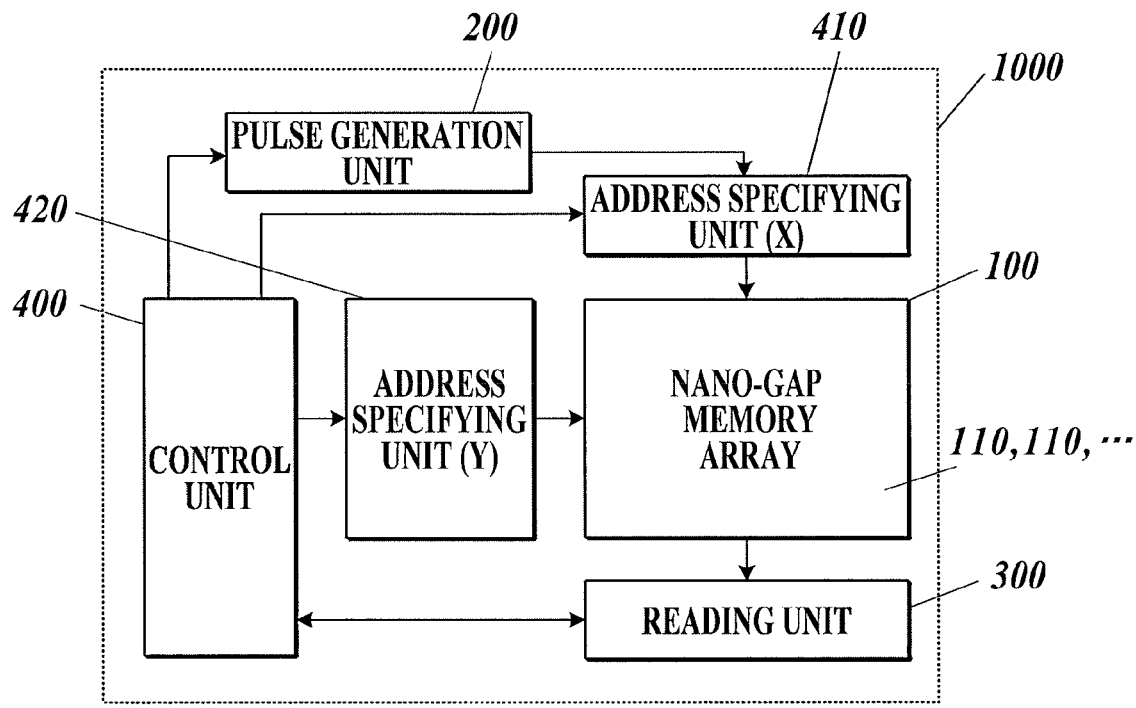
FIG. 1A is a block diagram showing a functional configuration of a storage device of the present invention.

Embodiments of the present invention will be explained below using the drawings. Note, however, that the scope of the invention is not limited to the embodiments shown in the drawings.

<Storage Device Including Nano-Gap Memory Elements>

First, a configuration of a storage device 1000 will be explained with reference to FIGS. 1A to 4B.

The storage device 1000 is a data-storing device that includes a memory element array in which a plurality of memory cells 110 are arranged in an array. Here, in the storage device 1000 of the present invention, each memory cell 110 is composed of a nano-gap memory element 10 and a MOS transistor 11 serving as a selection element. The memory element array is a nano-gap memory array 100.

Specifically, the storage device 1000 is configured to include, for example, as shown in FIG. 1A, the nano-gap memory array 100, a pulse generating unit 200, a reading unit 300, a control unit 400, an X-direction address specifying unit 410 that specifies the location in an X-direction of a memory cell 110 to select one of the memory cells 110 arranged side by side in an array, a Y-direction address specifying unit 420 that specifies the location in a Y-direction of the memory cell 110, and the like.

(Nano-Gap Memory Array)

The nano-gap memory array 100 is, for example, a high-density memory in which the plurality of memory cells 110 are arranged in an array (e.g., two-dimensional array).

Figure 1B:
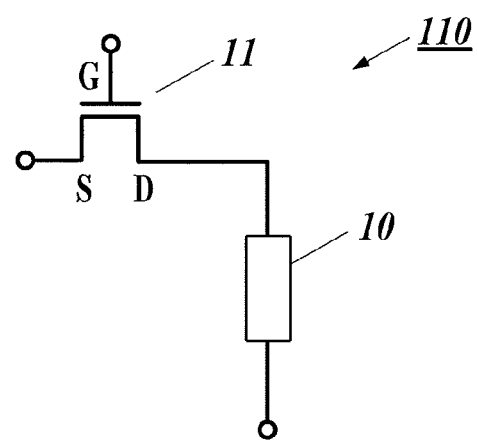
FIG. 1B is a diagram showing a configuration of one memory cell included in a nano-gap memory array of the storage device.

Each memory cell 110 is composed of, as shown in FIG. 1B, the MOS transistor 11 and the nano-gap memory element 10 connected to a drain electrode or source electrode of the MOS transistor 11. The MOS transistor 11 is connected at its source electrode or drain electrode to the X-direction address specifying unit 410, and is connected at its gate electrode to the Y-direction address specifying unit 420. When a first or second voltage pulse, which will be described later, is applied through the X-direction address specifying unit 410 and a specification signal is inputted from the Y-direction address specifying unit 420, the voltage pulse is applied to the nano-gap memory element 10 by which a phenomenon of a change in resistance value, which will be described later, occurs.

(Nano-Gap Memory Element)

The nano-gap memory element 10 is, for example, a memory element that stores data by switching the resistance value between nano-gap electrodes (a gap of an inter-electrode gap portion 4).

Figure 2:
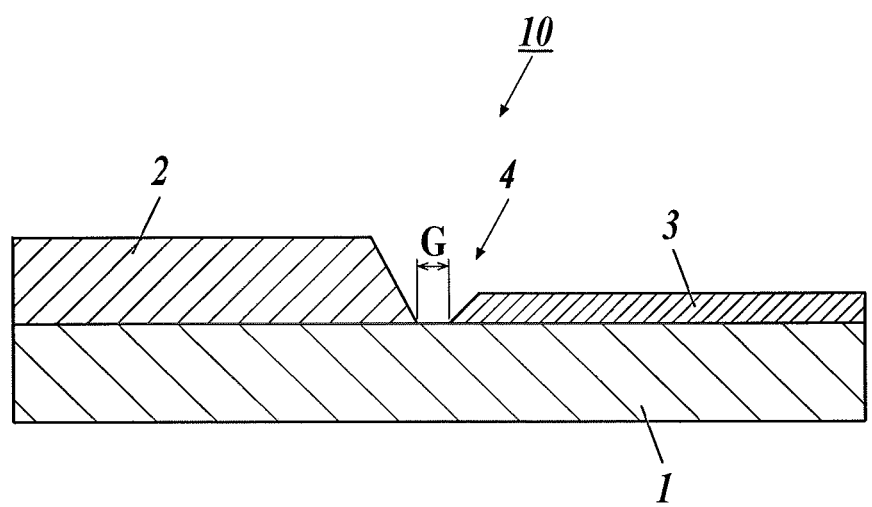
FIG. 2 is a cross-sectional view schematically showing a main part of a nano-gap memory element included in the storage device of the present invention.

Specifically, the nano-gap memory element 10 is configured to include, for example, as shown in FIG. 2, an insulating substrate 1, a first electrode 2 and a second electrode 3 which are provided on one surface (top surface) of the insulating substrate 1, the inter-electrode gap portion 4 provided between the first electrode 2 and the second electrode 3, and the like.

The insulating substrate 1 functions as, for example, a support for providing two electrodes (the first electrode 2 and the second electrode 3) of the nano-gap memory element 10 such that the electrodes are spaced apart.

The structure and material of the insulating substrate 1 are not particularly limited. Specifically, for example, the surface of the insulating substrate 1 may be planar in form or may be uneven in form. In addition, the insulating substrate 1 may be, for example, a semiconductor substrate of Si, etc. on a surface of which an oxide film or the like is provided or such that the substrate itself is insulating.

For the material of the insulating substrate 1, it is preferred to use, for example, glass, oxides such as silicon oxide ($SiO_2$) and nitrides such as silicon nitride (SiN). Among them, silicon oxide ($SiO_2$) is ideal in terms of high adhesiveness to the first electrode 2 and the second electrode 3 and high flexibility in fabrication thereof.

The first electrode 2 is, for example, to perform switching operation of the nano-gap memory element 10 with the second electrode 3.

The shape of the first electrode 2 is not particularly limited, and can be appropriately and arbitrarily modified.

The material of the first electrode 2 is not particularly limited as long as the material has conductivity. For example, the material is preferably at least one selected from gold, silver, platinum, palladium, nickel, aluminum, cobalt, chromium, rhodium, copper, tungsten, tantalum, carbon, and alloys thereof. Here, in order to enhance the adhesion properties of the first electrode 2 to the insulating substrate 1, for example, two or more layers of different metals may be used overlaid on top of each other. Specifically, for example, the first electrode 2 may have a stacked layer (multilayer) structure of chromium and gold.

The second electrode 3 is, for example, to perform switching operation of the nano-gap memory element 10 with the first electrode 2.

The shape of the second electrode 3 is not particularly limited, and can be appropriately and arbitrarily modified. The material of the second electrode 3 is not particularly limited as long as the material has conductivity. For example, the material is preferably at least one selected from gold, silver, platinum, palladium, nickel, aluminum, cobalt, chromium, rhodium, copper, tungsten, tantalum, carbon, and alloys thereof. Here, in order to enhance the adhesion properties of the second electrode 3 to the insulating substrate 1, for example, two or more layers of different metals may be used overlaid on top of each other. Specifically, for example, the second electrode 3 may have a stacked layer (multilayer) structure of chromium and gold.

The inter-electrode gap portion 4, for example, is formed between the first electrode 2 and the second electrode 3, and has the function of bringing about a phenomenon of a change in the resistance value of the nano-gap memory element 10.

Specifically, the inter-electrode gap portion 4 has, for example, a gap of the order of nanometers where a resistance switching phenomenon occurs by application of a predetermined voltage between the first electrode 2 and the second electrode 3. Namely, a distance (spacing) G between the first electrode 2 and the second electrode 3 (between the nano-gap electrodes) is set to be of the order of nanometers.

The distance (spacing) G between the first electrode 2 and the second electrode 3 (between the nano-gap electrodes) is preferably, for example, $0\ nm < G \leq 13\ nm$, and more preferably $0.8\ nm < G < 2.2\ nm$.

Here, the reason that the upper limit of the distance G is set to 13 nm is that when, for example, fabrication is performed by two oblique depositions, if the gap spacing is greater than 13 nm, then switching does not occur.

When typical values for a low-resistance state and a high-resistance state are substituted into a theoretical expression for tunnel current, a range of $0.8\ nm < G < 2.2\ nm$ is obtained as the result of computation of a gap width.

Note that a closest part between the first electrode 2 and the second electrode 3 (the gap of the inter-electrode gap portion 4) may be, for example, formed at one or more locations in a region where the first electrode 2 and the second electrode 3 face each other.

Note also that, for example, an island portion (sandbank portion) made of constituent materials of the first electrode 2 and the second electrode 3, etc., may be formed between the first electrode 2 and the second electrode 3. In this case, it only requires that the first electrode 2 and the second electrode 3 not be short-circuited by, for example, forming a predetermined gap (the gap of the inter-electrode gap portion 4) between the first electrode 2 and the island portion and between the second electrode 3 and the island portion.

(Pulse Generating Unit)

The pulse generating unit 200 is connected, for example, to the plurality of memory cells 110 included in the nano-gap memory array 100 and to the control unit 400. The pulse generating unit 200, for example, switches a low-resistance state and a high resistance state between a first electrode 2 and a second electrode 3 of a nano-gap memory element 10 in a memory cell 110 according to a control signal inputted from the control unit 400, and thereby writes data to the nano-gap memory element 10 or erases data from the nano-gap memory element 10.

Specifically, to the pulse generating unit 200, for example, address information about the location of a nano-gap memory element 10 that is to be switched between the low-resistance state and the high-resistance state is inputted from the control unit 400. When the information is inputted, the pulse generating unit 200, for example, switches the state of the resistance value of the nano-gap memory element 10 specified by the address information among the plurality of nano-gap memory elements 10 included in the nano-gap memory array 100.

Figure 3A:
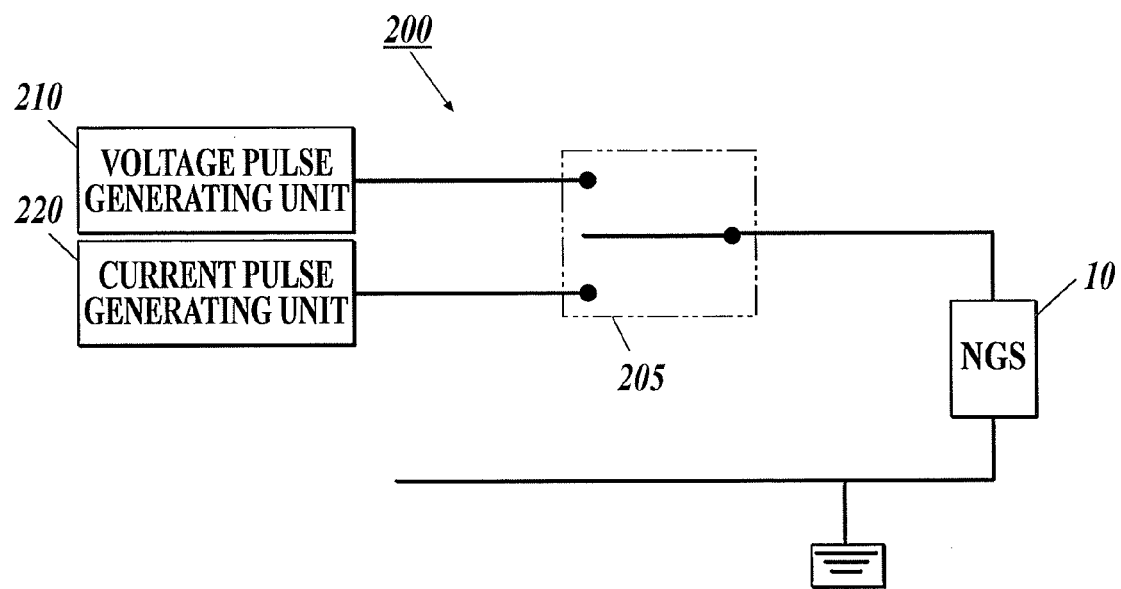
FIG. 3A is a block diagram showing a functional configuration of a pulse generating unit included in the storage device of the present invention.

The pulse generating unit 200 has a configuration shown in FIG. 3A in order to switch the resistance state of each individual nano-gap memory element 10.

Specifically, the pulse generating unit 200 includes a voltage pulse generating unit 210 that applies a voltage pulse with a predetermined voltage to a first electrode 2 of a nano-gap memory element 10; a current pulse generating unit 220 that applies a current pulse with a predetermined current to the first electrode 2 of the nano-gap memory element 10; and a switching element 205 that selectively connects the voltage pulse generating unit 210 or the current pulse generating unit 220 to the nano-gap memory element 10.

Note that a second electrode 3 of the nano-gap memory element 10 is grounded.

Note that the pulse generating unit 200 is provided so as to be connected to each nano-gap memory element 10 through the X-direction address specifying unit 410. Note also that although between the pulse generating unit 200 and each nano-gap memory element 10 there are intervened the address specifying unit 410 and a MOS transistor 11 in practice, depiction thereof is omitted in FIG. 3A.

The switching element 205 is controlled by the control unit 400 to perform switching in conjunction.

Specifically, the switching element 205 functions under control of the control unit 400 such that the voltage pulse generating unit 210 is directly connected to the first electrode 2 of the nano-gap memory element 10 (hereinafter, referred to as a first connection state). By virtue of the switching, a voltage pulse for switching the nano-gap memory element 10 from the low-resistance state to the high-resistance state is applied to the nano-gap memory element 10 from the voltage pulse generating unit 210, thereby switching from the low-resistance state to the high-resistance state is performed. Note that the voltage value of a voltage pulse from the voltage pulse generating unit 210 is appropriately adjusted according to the characteristics of the nano-gap memory element 10 so as to apply an appropriate voltage thereby switching from the low-resistance state to the high-resistance state is performed.

In addition, the switching element 205 functions under control of the control unit 400 such that the current pulse generating unit 220 is connected to the first electrode 2 of the nano-gap memory element 10 (hereinafter, referred to as a second connection state). By virtue of the switching, a current pulse is applied to the nano-gap memory element 10 from the current pulse generating unit 220, thereby switching from the high-resistance state to the low-resistance state is performed.

Figure 3B:
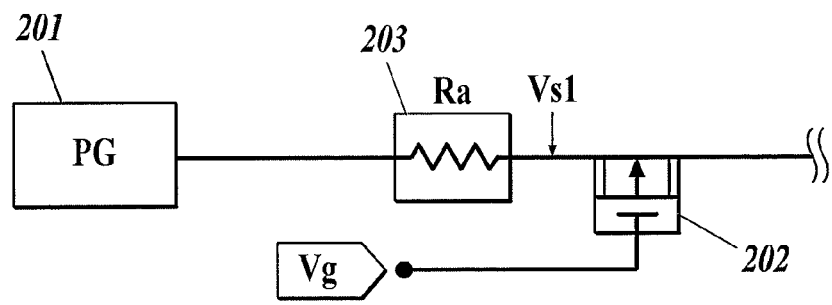
FIG. 3B is a diagram showing a configuration of a current pulse generating unit.

The current pulse generating unit 220 mainly includes, as shown in FIG. 3B, a pulse generator 201 that generates a voltage pulse; and a resistance element 203 and a field-effect transistor (P-type MOSFET) 202 which are provided between the pulse generator 201 and the nano-gap memory element 10.

A voltage value Vpp2 of a second voltage pulse generated by the pulse generator 201 is determined according to the characteristics of the field-effect transistor 202. The field-effect transistor 202 has a source electrode connected to the side of the pulse generator 201, and has a drain electrode connected to the side of the nano-gap memory element 10, and has a gate electrode to which voltage Vg is always applied. In the field-effect transistor 202, when voltage Vs1 on the source electrode side becomes higher by a certain value (referred to as Vth) than the voltage Vg on the gate electrode side, current starts to flow from the source electrode to the drain electrode side. When the resistance value of the resistance element 203 immediately before the field-effect transistor 202 is Ra and the current value is ic, the voltage value Vpp2 of the second voltage pulse generated by the pulse generator 201 in the second connection state is set such that:

$$Vpp2 = Vg + Vth + ic \times Ra.$$

Figure 4A:
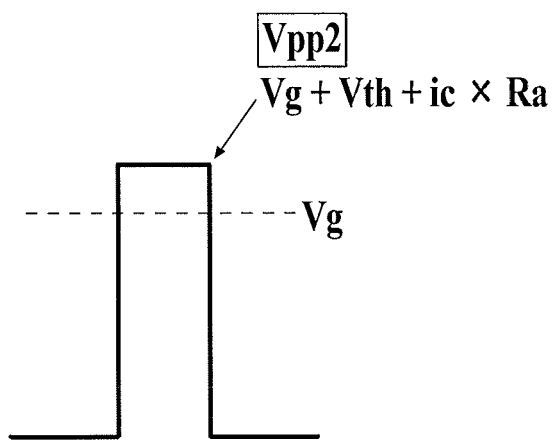
FIG. 4A is a line diagram showing a change in pulse voltage from a pulse generator in the current pulse generating unit.
Figure 4B:
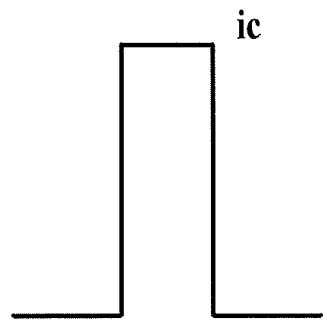
FIG. 4B is a line diagram showing a change in a current value of a current pulse flowing through a nano-gap memory element.

Namely, when the pulse generator 201 generates a voltage pulse Vpp2, with the current passed to the nano-gap memory element 10 being maintained at ic by the field-effect transistor 202, a current pulse is applied to the nano-gap memory element 10. Namely, the field-effect transistor 202 functions as a constant current circuit. That is, when, as shown in FIG. 4A, the pulse generator 201 applies a voltage pulse with the voltage value being Vpp2, as shown in FIG. 4B, a current pulse flows through the nano-gap memory element 10 at the same pulse width as the second voltage pulse, with the constant value ic being maintained. As a result, the nano-gap memory element 10 is switched from the high-resistance state to the low-resistance state.

As explained above, by using the field-effect transistor 202 which is a constant current circuit and the resistor 203 when applying a current pulse to the nano-gap memory element 10, the nano-gap memory element 10 is switched from the high-resistance state to the low-resistance state, and excessive current due to the change in resistance value is suppressed from flowing and thus the current value can be stably maintained at a desired value. Accordingly, failure of switching to the low-resistance state is avoided, enabling to improve the success rate.

In addition, when the nano-gap memory element 10 goes through a great resistance change from high resistance to low resistance upon writing data, a breakdown of the device such as a break in a wire caused by a sudden increase in current flowing through the device is prevented.

Note that by configuring the memory cell 110 such that at least a constant current element is connected (the MOS transistor 11 is further connected) to the nano-gap memory element 10, the write speed can be increased. This is because the charge and discharge currents of a wiring line up to the point of the memory cell 110 are not limited by the resistor. Although there is a possibility of an increase in memory cell area, if the constant current element and the electrodes of the memory element can be formed in a stacked layer structure, then the increase in memory cell area can be avoided.

In this case, the current pulse generating unit 220 shown in FIG. 3A is not necessary, and voltage drive of the memory cell can be performed from the pulse generating unit 210. The constant current element can be implemented by a depression type field-effect device.

In addition, it is also possible to allow the selection transistor 11 of the memory cell 110 to further have the function of the constant current element. In this case, the gate voltage of the selection transistor upon writing from the high-resistance state to the low-resistance state is set to a value at which a constant current value is maintained, e.g., in the case of using a PMOS, "source voltage (Vs1)−Vth−α" (α is depending on the set current value). Namely, by setting the continuity of the selection transistor 11 to a MOS saturation region characteristic, a constant current circuit is formed (the gate voltage of an unselected cell is, of course, the same as the source voltage, i.e., in an Off state).

On the other hand, upon writing or reading from the low-resistance state to the high-resistance state, by allowing the gate voltage to be full-swung to positive and negative power supply values, conducting and non-conducting as a normal selection transistor are enabled, and thus, cell selectivity can be achieved. By such a control of the gate voltage, the transistor 11 can be allowed to have both of the memory cell selection function and constant current function.

(X-Direction and Y-Direction Address Specifying Units)

The X-direction address specifying unit 410 includes a plurality of wiring lines, to each of which are connected in parallel the source electrodes or drain electrodes of MOS transistors 11 included in a plurality of memory cells 110 arranged side by side in the Y-direction among the plurality of memory cells 110 provided in an array. The wiring lines are provided to be arranged side by side in the X-direction. A voltage pulse can be applied to the wiring lines individually from the pulse generating unit 200.

The Y-direction address specifying unit 420 includes a plurality of wiring lines, to each of which are connected in parallel the gate electrodes of MOS transistors 11 included in a plurality of memory cells 110 arranged side by side in the X-direction among the plurality of memory cells 110 provided in an array. The wiring lines are provided to be arranged side by side in the Y-direction. A voltage serving as a specification signal can be applied to the wiring lines individually, which enables each MOS transistor 11 to establish a connection between the source and drain electrodes.

That is, by applying a specification signal to a corresponding wiring line according to the specification of a location provided to the Y-direction address specifying unit 420 and applying a voltage pulse to a corresponding wiring line according to the specification of a location provided to the X-direction address specifying unit 410, application of the voltage pulse to an arbitrary nano-gap memory element 10 identified by the specification of the locations in the X- and Y-directions can be performed.

(Reading Unit)

The reading unit 300 is connected, for example, to the plurality of nano-gap memory elements 10 of the memory cell 110 included in the nano-gap memory array 100 and to the control unit 400. The reading unit 300, for example, reads data from a nano-gap memory element 10 according to a control signal inputted from the control unit 400 and outputs the result of the reading to the control unit 400.

Specifically, to the reading unit 300, for example, is inputted from the control unit 400 address information about the location of a nano-gap memory element 10 from which data is to be read. When the information is inputted, the reading unit 300, for example, measures the resistance value between the nano-gap electrodes (the gap of the inter-electrode gap portion 4) of the nano-gap memory element 10 specified by the address information among the nano-gap memory elements 10 included in the nano-gap memory array 100, and thereby reads data from the nano-gap memory element 10.

(Control Unit)

The control unit 400 performs control to apply a voltage pulse or a current pulse to an arbitrary nano-gap memory element 10 by inputting a control signal to the pulse generating unit 200 and inputting address signals to the X-direction and Y-direction address specifying units 410 and 420.

At this time, when applying a voltage pulse (when a predetermined nano-gap memory element 10 is switched from the low-resistance state to the high-resistance state), the control unit 400 performs control to switch the switching element 205 in the pulse generating unit 200 to the first connection state and apply a voltage pulse to the nano-gap memory element 10 from the voltage pulse generating unit 210.

By the control, the voltage pulse is applied to the nano-gap memory element 10 and switching to the high-resistance state (hereinafter, also referred to as an "OFF state") is performed.

When applying a current pulse, the control unit 400 performs control to switch the switching element 205 to the second connection state and apply a current pulse to the nano-gap memory element 10 from the current pulse generating unit 220.

By the control, the current pulse is applied to the nano-gap memory element 10 and switching to the low-resistance state is performed (hereinafter, also referred to as an "ON state"). At this time, during the generation of a current pulse, a state in which a constant current is flows through the nano-gap memory element 10 is maintained by the field-effect transistor 202.

In addition, for example, after the current pulse is applied, the control unit 400 inputs a control signal (address information, etc.) to the reading unit 300 to read data from the nano-gap memory element. Then, based on the result of the reading, the control unit 400 determines whether the nano-gap memory element 10 has shifted from the high-resistance state to the low-resistance state.

If, as a result of the determination, the nano-gap memory element 10 has not shifted from the high-resistance state to the low-resistance state, then control may be performed to retry application of the current pulse.

(Variation of a Nano-Gap Memory Element)

Note that the present invention is not limited to the above-described embodiment, and various modifications and design changes may be made thereto without departing from the gist and scope of the present invention.

A variation of a nano-gap memory element according to the present invention will be described below.

Figure 5:
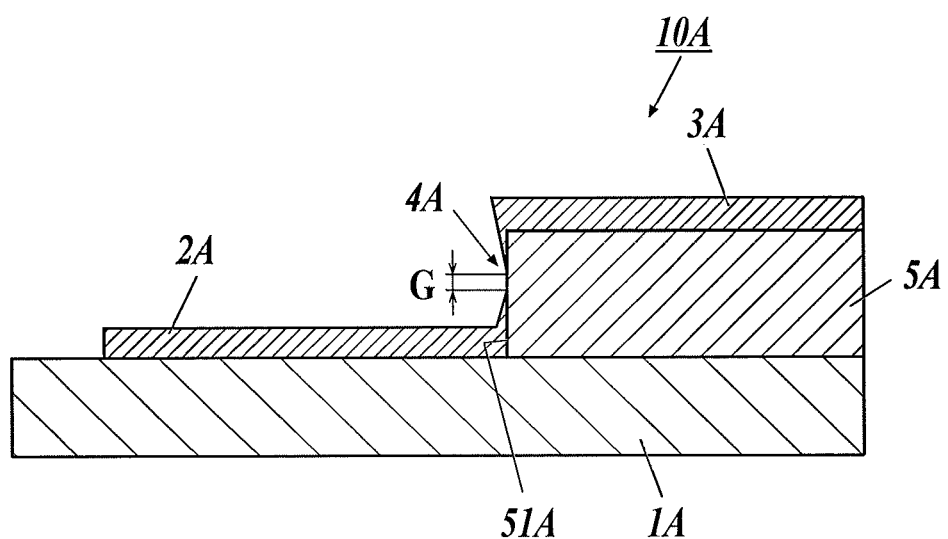
FIG. 5 is a cross-sectional view schematically showing a main part of another nano-gap memory element.

A nano-gap memory element 10A of a first variation mainly includes, for example, as shown in FIG. 5, an insulating substrate 1A, an insulator 5A provided on a top surface of the insulating substrate 1A, a first electrode 2A provided on the top surface of the insulating substrate 1A, a second electrode 3A provided on a top surface of the insulator 5A, and an inter-electrode gap portion 4A provided between the first electrode 2A and the second electrode 3A.

Specifically, by the insulator 5A being provided on the top surface of the insulating substrate 1A, a step portion is formed. By the insulator 5A, the first electrode 2A and the second electrode 3A are disposed on the substrate 1A at different levels. The first electrode 2A is provided in contact with the top surface of the insulating substrate 1A and with a lower portion of a side 51A of the insulator 5A. The second electrode 3A is provided in contact with the top surface of the insulator 5A and with an upper portion of the side 51A of the insulator 5A. The inter-electrode gap portion 4A is provided between the first electrode 2A provided at the lower portion of the side 51A of the insulator 5A and the second electrode 3A provided at the upper portion of the side 51A of the insulator 5A. That is, the inter-electrode gap portion 4A has a gap G formed in a height direction of the step portion formed by the insulator 5A.

Note that for the material of the first electrode 2A and the second electrode 3A it is desirable to select the same one as that of the aforementioned first electrode 2 and second electrode 3.

The insulator 5A is used to dispose a facing part of the first electrode 2A and a facing part of the second electrode 3A which form the inter-electrode gap portion 4A such that the facing parts are arranged side by side in a height direction relative to the plane of the substrate 1A. Therefore, as long as the above-described function is provided, any other structure may be adopted.

In addition, the insulator 5A, for example, may be one obtained by providing an oxide film, etc., on a part of the insulating substrate 1A, or may be formed by providing an oxide film, etc., on the entire surface of the insulating substrate 1A and removing a part of the oxide film, etc. For the material of the insulator 5A, it is preferred to use, for example, glass, oxides such as silicon oxide ($SiO_2$) and nitrides such as silicon nitride ($Si_3N_4$). Among them, silicon oxide ($SiO_2$) is ideal in terms of high adhesiveness to the first electrode 2A and the second electrode 3A and high flexibility in fabrication thereof.

The substantial structure of the inter-electrode gap portion 4A is almost the same as that of the aforementioned inter-electrode gap portion 4, except that the orientation of a plane to be formed is different. Therefore, the design conditions of the inter-electrode gap portion 4A such as dimensions and the operation method for the inter-electrode gap portion 4A are the same as those in the case of the aforementioned inter-electrode gap portion 4.

By the memory element 10A of the first variant, the same technical effect as that of the aforementioned memory element 10 is provided, and the first electrode 2A and the second electrode 3A are disposed at different levels by a step portion formed by the insulator 5A on the top surface of the insulating substrate 1A, and the inter-electrode gap portion 4A is formed in a height direction thereof. Thus, compared to the case in which the first electrode 2A, the second electrode 3A, and the inter-electrode gap portion 4A are disposed side by side on the same plane, the area occupied by the inter-electrode gap portion 4A, as viewed from the top of the insulating substrate 1A can be reduced. By virtue of the structure, when, for example, memory elements are formed by sharing a single insulating substrate 1A and integrating multiple memory elements 10A, it is advantageous in integration, enabling to achieve miniaturization of the memory elements.

(Another Example of Method of Applying Current Pulse to Nano-Gap Memory Element)

A current pulse applied to a nano-gap memory element 10 may be in any range as long as the current pulse can allow the nano-gap memory element 10 to transition from the high-resistance state to the low-resistance state. For example, application of a current pulse may be performed in a stepwise manner by changing the current value in the middle of the pulse application, and current flowing through the nano-gap memory element 10 may be maintained at the individual current values of the current pulse which change in a stepwise manner, by the field-effect transistor 202.

Figure 6A:
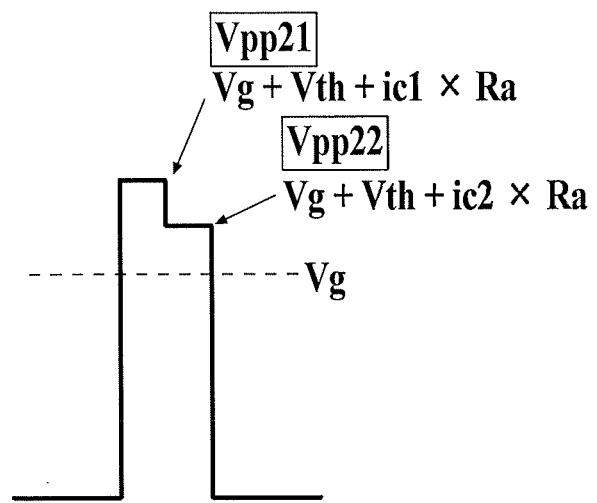
FIG. 6A is a line diagram showing a change of a voltage of a voltage pulse from a pulse generator in another example.

Specifically, as shown in FIG. 6A, application of a voltage pulse is performed by the pulse generator 201 at two-step voltage values from Vpp21 to Vpp22 (<Vpp21).

Note that $$Vpp21 = Vg + Vth + ic1 \times Ra,$$

$$Vpp22 = Vg + Vth + ic2 \times Ra.$$

Figure 6B:
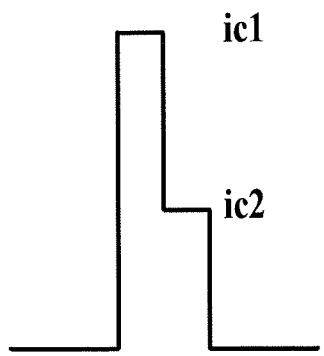
FIG. 6B is a line diagram showing a change in a current value of a current pulse in another example.

By the method, to the nano-gap memory element 10, as shown in FIG. 6B, a current pulse where the current ic1 flows with a constant state maintained for the same period as that of the application of Vpp21, and then, the current ic2 flows with a constant state maintained for the same period as that of the application of Vpp22, is applied to the nano-gap memory element 10.

By using such a current pulse, charging of a parasitic capacitance between the current pulse generating unit 220 and a nano-gap memory element can be performed rapidly, and thus, it can be expected that the pulse width required to change the resistance value of the nano-gap memory element 10 is reduced, i.e., the time required for rewriting is reduced.

Note that the application of a current pulse is not limited to a two-step change such as that described above, but a multi-step change may be used, or instead of a stepwise manner a change may be made in any waveform manner. For example, a pulse generating source may generate a voltage pulse with any waveform, and the constant current circuit may arbitrarily change the current flowing through the nano-gap memory element 10 (or 10A) according to the waveform.

Examples

The present invention will be described in more detail below by specific examples, but the present invention is not limited thereto.

Here, examples using the nano-gap memory element 10A shown in FIG. 5 will be described. Note that needless to say the nano-gap memory element 10 may be adopted.

Figure 7A:
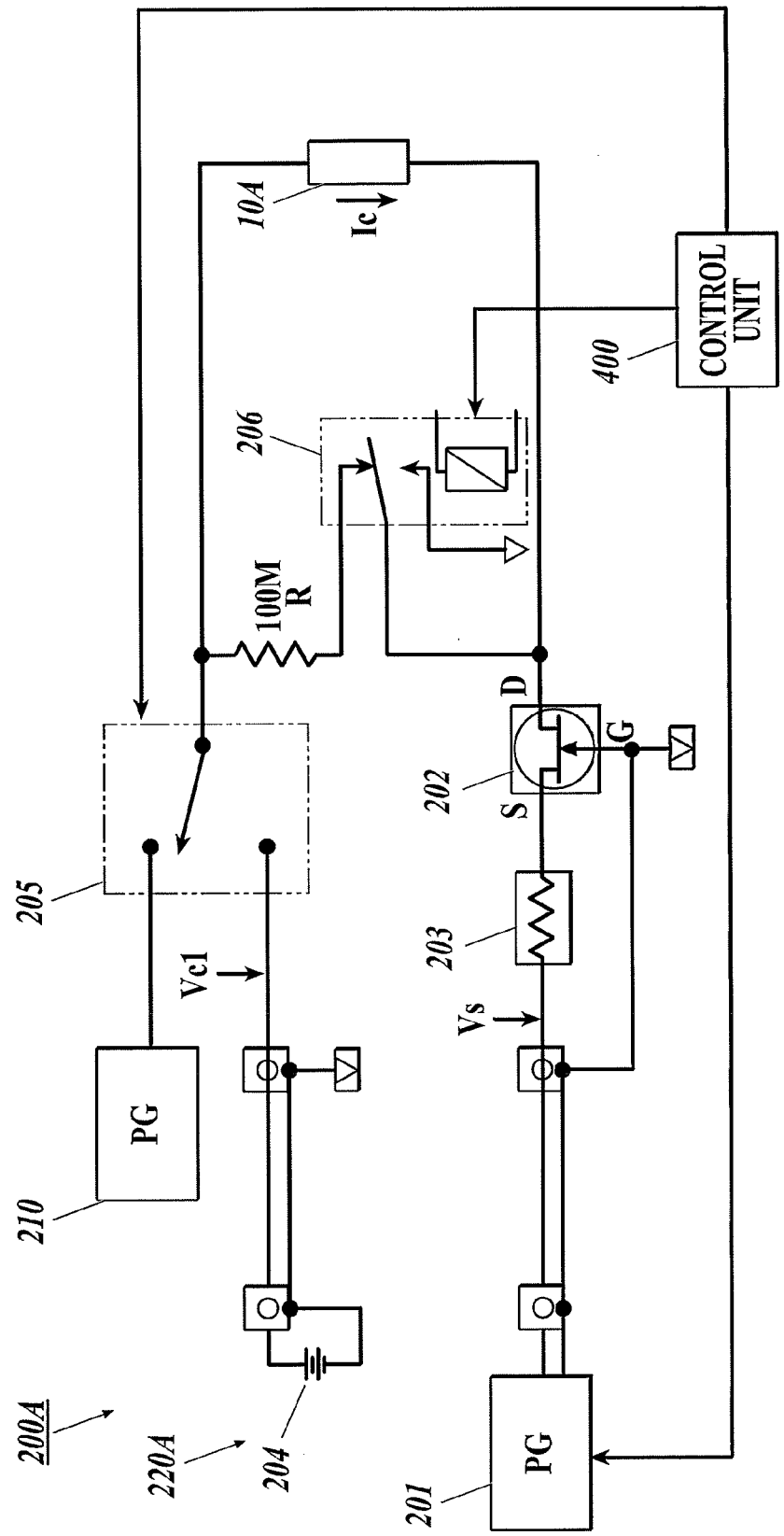
FIG. 7A is a block diagram showing a functional configuration of a pulse generating unit of an example.

In this example, a pulse generating unit 200A shown in FIG. 7A is used. The pulse generating unit 200A includes a voltage pulse generating unit 210 that applies a voltage pulse to the side of the first electrode 2 of the nano-gap memory element 10A; a current pulse generating unit 220A that applies a current pulse with a predetermined current to the first electrode 2 of the nano-gap memory element 10A; and a switching element 205 that selectively connects the voltage pulse generating unit 210 or the current pulse generating unit 220A to the nano-gap memory element 10A.

The current pulse generating unit 220A includes a pulse generator 201, a field-effect transistor 202, and a resistance element 203, and further includes a direct-current power supply 204 and a second switching element 206. The second switching element 206 is controlled by the control unit 400 to operate in conjunction with the switching element 205. As an initial state for writing by a current pulse, the potential difference between nano-gap memory elements is set to zero, and upon application of a voltage pulse, switching is performed such that current does not flow through the nano-gap memory element 10A from the current pulse generating unit 220A and voltage from the voltage pulse generating unit 210 is applied.

A drain electrode of the field-effect transistor 202 is connected to the second electrode 3 of the nano-gap memory element 10A, and the pulse generator 201 is connected through the resistance element 203 (e.g., 1 MΩ) to a source electrode of the field-effect transistor 202.

The direct-current power supply 201A can arbitrarily adjust an output voltage Vc1 in a range of 10 to 20 V.

Figure 7B:
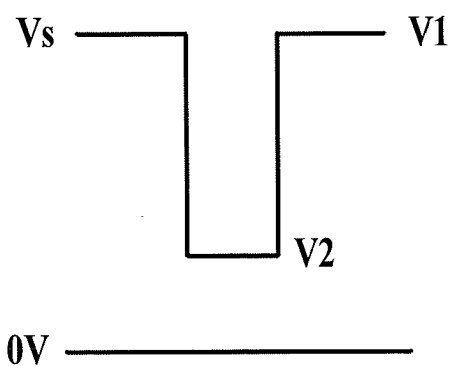
FIG. 7B is a line diagram showing a change of voltage applied to a source electrode of a field-effect transistor by a pulse generator.

The field-effect transistor 202 has (depression type) characteristics that when the potential difference between the gate and source electrodes is large, current does not flow from the source electrode to the drain electrode, and when the potential difference is small, current flows. Therefore, upon application of a current pulse, the pulse generator 201 applies, in a state in which a reference voltage V1 is being applied to the source electrode of the field-effect transistor 203 as an output voltage Vs from the pulse generator 201, a pulse voltage V2 lower than the reference voltage V1, thereby the source and drain electrodes can be energized and thus a current pulse is applied to the nano-gap memory element 10A (see FIG. 7B). Note that by the action of the field-effect transistor 202 and the resistance element 203, the value of current flowing through the nano-gap memory element 10A can be maintained constant during the application of a current pulse.

Namely, as with the aforementioned pulse generating unit 200, the pulse generating unit 200A can also switch the resistance state of the nano-gap memory element 10A.

Figure 7C:
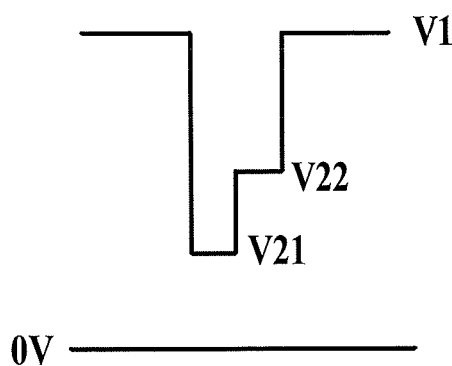
FIG. 7C is a line diagram showing a change of voltage applied to the source electrode of the field-effect transistor from the pulse generator, when a current pulse is applied to a nano-gap memory element such that the current value changes in a stepwise manner.

In addition, when a current pulse is applied to the nano-gap memory element 10A such that the current value changes in a stepwise manner, like the aforementioned example of FIG. 6B, as shown in FIG. 7C, by applying a pulse voltage V21 lower than the reference voltage V1 and further changing the pulse voltage level to V22 (V21<V22<V1), a current pulse which is similar to a voltage waveform and which changes during a pulse period can be applied.

Application of a voltage pulse and a current pulse to the nano-gap memory element 10A was repeatedly and alternately performed using the pulse generating unit 200A, and the resistance value between the nano-gap electrodes (the gap of the inter-electrode gap portion 4A) of the nano-gap memory element 10A at that time was measured after the application of each pulse. Upon application of a voltage pulse, the rewrite voltage pulse to a high resistance value is set to 7 V and the pulse width was set to 50 ns, and upon application of a current pulse, Vc1=15 V, the reference voltage V1 of the pulse generator 201=5.5 V, and the pulse voltage V2=1.04 V. The value of current Ic flowing through the nano-gap memory element 10A thereby was 3.5 µA and the pulse width was 10 µs.

In addition, as a comparative example, switching from the low-resistance state to the high-resistance state and switching from the high-resistance state to the low-resistance state of the same nano-gap memory element 10A were both performed using a voltage pulse without using a constant current circuit, and application of voltage pulses was repeatedly and alternately performed, and the resistance value between the nano-gap electrodes (the gap of the inter-electrode gap portion 4A) of the nano-gap memory element 10A at that time was measured after the application of each voltage pulse. In the comparative example, the voltage of a first voltage pulse applied to the nano-gap memory element 10A was set to 10 V, the voltage of a second voltage pulse was set to 5V, and the pulse width of both voltage pulses was set to 500 ns.

Figure 8:
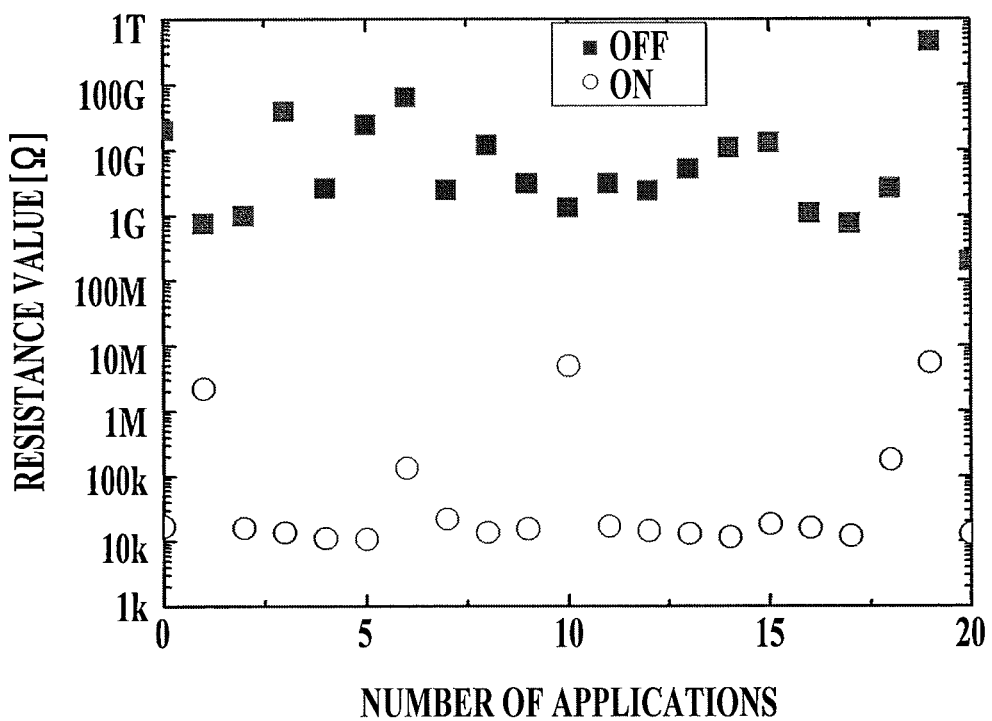
FIG. 8 is a graph showing changes of resistance values of a nano-gap memory element of an example for when a voltage pulse that allows the device to transition from a low-resistance state to a high-resistance state and a current pulse that allows the device to transition from the high-resistance state to the low-resistance state are alternately and repeatedly applied.
Figure 9:
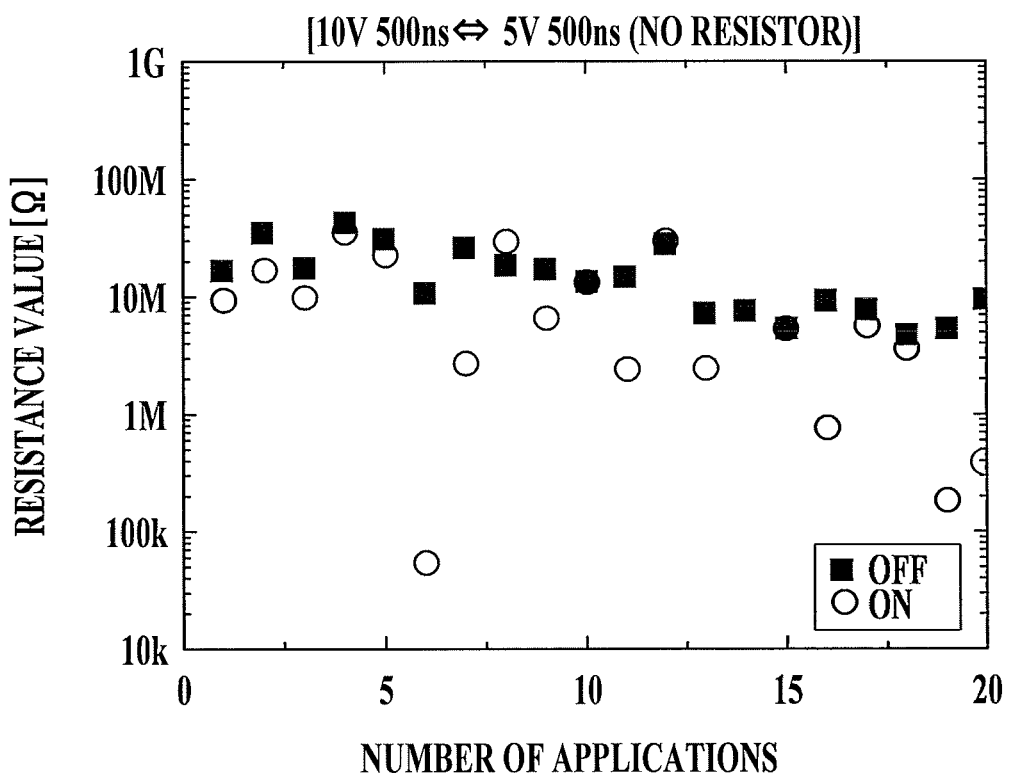
FIG. 9 is a graph showing changes of resistance values of a nano-gap memory element in a comparative example for when a voltage pulse that allows the device to transition from a low-resistance state to a high-resistance state and a voltage pulse that allows the device to transition from the high-resistance state to the low-resistance state are alternately and repeatedly applied.

FIG. 8 is a graph showing resistance values for each switching of the resistance state in the example. FIG. 9 is a graph showing resistance values for each switching of the resistance state in the comparative example. In each graph, ■ represents resistance values for OFF and ○ represents resistance values for ON.

In the case of the comparative example, as shown in FIG. 9, there are many cases in which switching from the high-resistance state to the low-resistance state is not sufficiently performed at ON, and there are many variations in both the resistance value for OFF and the resistance value for ON, causing significant overlap between the numerical range of resistance for the high-resistance state and the numerical range of resistance for the low-resistance state. As a result, when the nano-gap memory element 10A is used as one storage element in a storage device, identification of ON and OFF is difficult, resulting in insufficient practicality.

On the other hand, in the example, as shown in FIG. 8, the resistance values of the nano-gap memory element 10A for OFF and the resistance values of the nano-gap memory element 10A for ON are distributed in different bands, and thus, there is almost no overlap between the numerical range of resistance for the high-resistance state and the numerical range of resistance for the low-resistance state. That is, it can be seen that by determining a certain threshold value, whether the nano-gap memory element 10A is in an ON state or an OFF state can be more securely identified, and thus, practicality as a storage device is improved.

Figure 10:
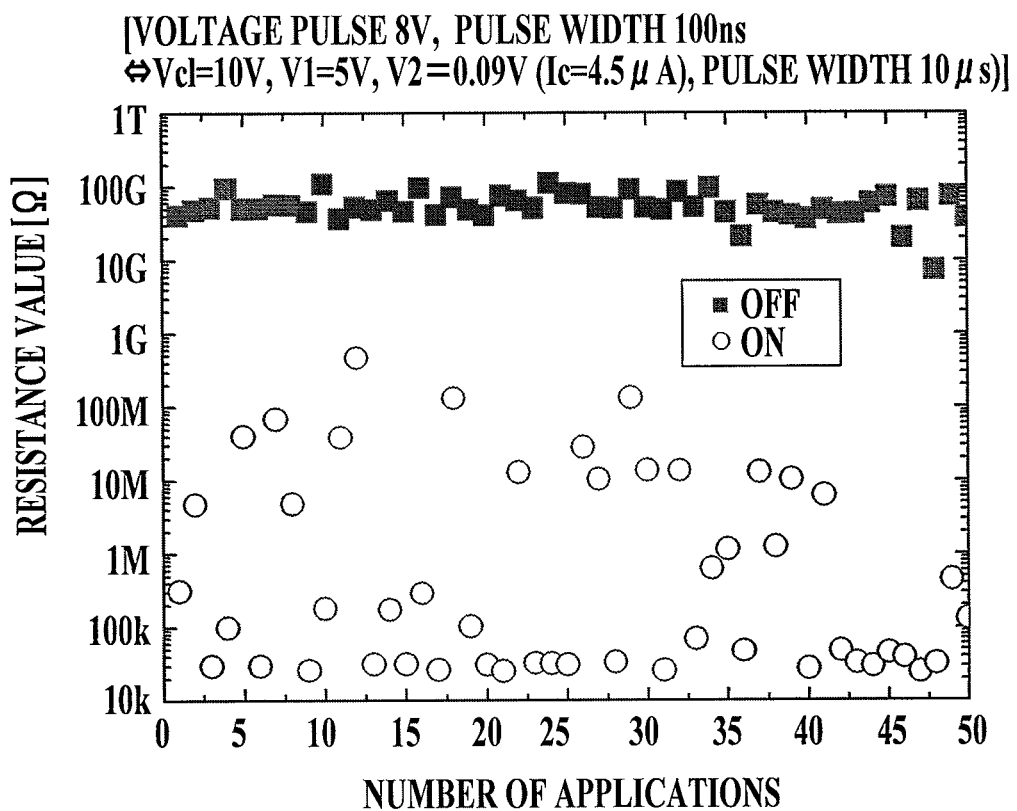
FIG. 10 is a graph showing changes of resistance values of a nano-gap memory element for when a voltage pulse that allows the device to transition from a low-resistance state to a high-resistance state and a current pulse that allows the device to transition from the high-resistance state to the low-resistance state are alternately and repeatedly applied, in another example in which the device has the same configuration as that of the example and only a width of pulses to be applied to the memory element is changed.

FIG. 10 shows the results of measurement of the resistance value of the nano-gap memory element 10A for when the same test as that of FIG. 8 was conducted, with the rewrite voltage pulse to a high resistance value being set to 8 V and the pulse width being set to 100 ns, and Vc1=10 V, the reference voltage V1 of the pulse generator 201=5V, and the pulse voltage V2=0.09 V upon application of a current pulse, thereby the value of current Ic flowing through the nano-gap memory element 10A was 4.5 µA and the pulse width was 10 µs.

In an example of FIG. 10, as with FIG. 8, it can be seen that the resistance values of the nano-gap memory element 10A after application of a voltage pulse and the resistance values of the nano-gap memory element 10A after application of a current pulse are distributed in different bands, and the numerical range of resistance for the high-resistance state and the numerical range of resistance for the low-resistance state are favorably separated from each other, and thus, identification of the ON and OFF states of the nano-gap memory element 10A can be easily performed, and accordingly, practicality as a storage device is improved.

In addition, it was observed that when switching the nano-gap memory element 10A from the OFF state to the ON state, even if the value of current flowing through the nano-gap memory element 10A was changed, the switching was favorably performed without reducing the success rate of switching.

(Advantageous Effects of Embodiment of the Invention)

As described above, in the storage device 1000, in the pulse generating unit 200 (or 200A), upon application of a current pulse to a nano-gap memory element 10 (or 10A), the value of current flowing through the nano-gap memory element 10 (or 10A) is maintained in a constant state using the field-effect transistor 202 serving as a constant current circuit. By virtue of the configuration, even when the nano-gap memory element 10 (or 10A) is switched to the low-resistance state by application of a current pulse, since a predetermined current value is maintained even during the application of the pulse, switching of the resistance state is performed at a high success rate.

As a result, the resistance values of the nano-gap memory element 10 (or 10A) after application of a voltage pulse and the resistance values after application of a current pulse can be distributed in different bands, enabling to effectively suppress overlap between the numerical range of the resistance value for the high-resistance state and the numerical range of the resistance value for the low-resistance state. Therefore, an improvement in the reliability and practicality of the nano-gap memory element 10 (or 10A) as a storage element can be achieved.

(Others)

By sealing a part (e.g., the nano-gap memory array 100) or whole of the storage device 1000 with a predetermined sealing member, the inter-electrode gap portions 4 may be prevented from exposing to air or moisture. The nano-gap memory elements 10 (or 10A) can be allowed to operate more stably. Furthermore, by sealing with the predetermined sealing member, a state in which the inter-electrode gap portions 4 are disposed in an arbitrary atmosphere can be maintained, and thus, the nano-gap memory elements 10 (or 10A) can be used in the arbitrary atmosphere.

Note that the values of the applied voltage and current from the pulse generating units 200, 200A are appropriately selected according to the characteristics of the nano-gap memory elements 10, 10A, and are not limited to the above-described example.

Although in the storage device 1000 the case of storing in the nano-gap memory array 100 is exemplified, a device composed of a nano-gap memory element 10 which is a single unit, and a pulse generating unit 200, a reading unit 300, and a control unit 400 for the nano-gap memory element 10 may be used as a storage device.

INDUSTRIAL APPLICABILITY

There is applicability in the field of memory elements in which ON and OFF can be switched by application of a voltage pulse.

REFERENCE SIGNS LIST

1: insulating substrate
2: first electrode
3: second electrode
4: inter-electrode gap portion 10, 10A: nano-gap memory element (memory element)
200, 200A: pulse generating unit
202: field-effect transistor (constant-current circuit)
201: pulse generator (pulse generating source)
210: voltage pulse generating unit
220, 220A: current pulse generating unit
1000: storage device

What is claimed is:

1. A storage device, comprising:
a memory element comprising an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs; and
a current pulse generating unit that generates a current pulse for performing a shift from a high-resistance state to a low-resistance state, wherein
the current pulse generating unit applies the current pulse to the memory element by a constant current circuit.

2. The storage device according to claim 1, wherein the current pulse generating unit applies the current pulse by the constant current circuit such that a current value changes in a stepwise manner.

* * * * *